United States Patent
Masuoka et al.

(10) Patent No.: US 8,258,587 B2
(45) Date of Patent: Sep. 4, 2012

(54) TRANSISTOR PERFORMANCE WITH METAL GATE

(75) Inventors: Yuri Masuoka, Jhubei (TW);
Shyh-Horng Yang, Hsin-Chu (TW);
Peng-Soon Lim, Johor (MY)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 433 days.

(21) Appl. No.: 12/561,358

(22) Filed: Sep. 17, 2009

(65) Prior Publication Data
US 2010/0084719 A1 Apr. 8, 2010

Related U.S. Application Data

(60) Provisional application No. 61/103,051, filed on Oct. 6, 2008.

(51) Int. Cl.
*H01L 29/792* (2006.01)
*H01L 21/336* (2006.01)

(52) U.S. Cl. ........... 257/411; 257/412; 257/E21.523; 257/E21.437; 257/E29.309; 438/197; 438/287; 438/294; 438/396; 438/588; 438/592; 438/692

(58) Field of Classification Search ........... 257/411, 257/412; 438/197, 287, 294, 396, 588, 592, 438/692
See application file for complete search history.

(56) References Cited

U.S. PATENT DOCUMENTS

| | | | | |
|---|---|---|---|---|
| 6,544,873 | B1 * | 4/2003 | Yeom et al. | 438/588 |
| 6,790,734 | B2 * | 9/2004 | Kohno et al. | 438/301 |
| 7,335,581 | B2 * | 2/2008 | Saitoh et al. | 438/595 |
| 7,723,174 | B2 * | 5/2010 | Waite et al. | 438/216 |
| 2004/0132236 | A1 * | 7/2004 | Doris et al. | 438/182 |
| 2006/0177983 | A1 * | 8/2006 | Trivedi | 438/270 |
| 2010/0112800 | A1 * | 5/2010 | Chen et al. | 438/592 |

OTHER PUBLICATIONS

Chinese Patent Office, Office Action dated Nov. 4, 2010; Application No. 200910178783.1. 5 pages.

* cited by examiner

*Primary Examiner* — Jerome Jackson, Jr.
*Assistant Examiner* — David Spalla
(74) *Attorney, Agent, or Firm* — Haynes and Boone, LLP

(57) ABSTRACT

The present disclosure provides a method for making a semiconductor device having metal gate stacks. The method includes forming a high k dielectric material layer on a semiconductor substrate; forming a metal gate layer on the high k dielectric material layer; forming a top gate layer on the metal gate layer; patterning the top gate layer, the metal gate layer and the high k dielectric material layer to form a gate stack; performing an etching process to selectively recess the metal gate layer; and forming a gate spacer on sidewalls of the gate stack.

23 Claims, 7 Drawing Sheets

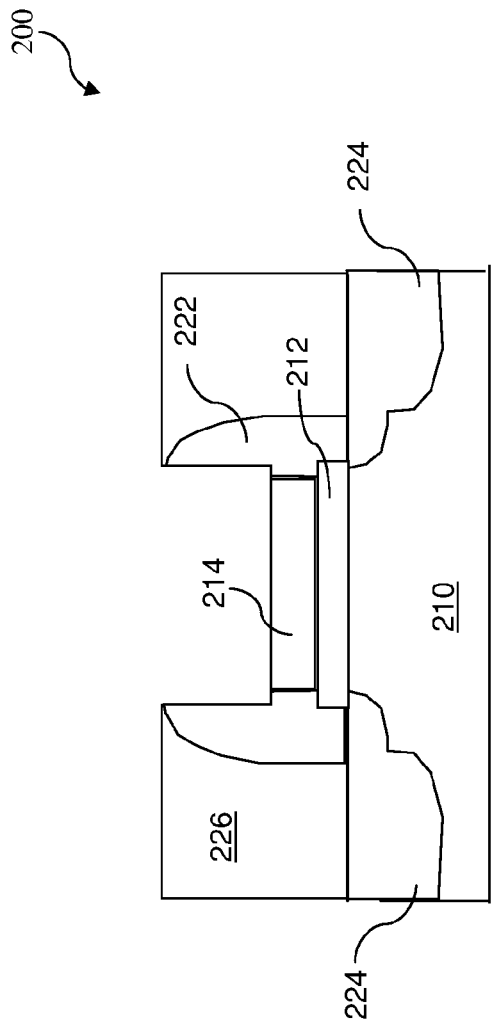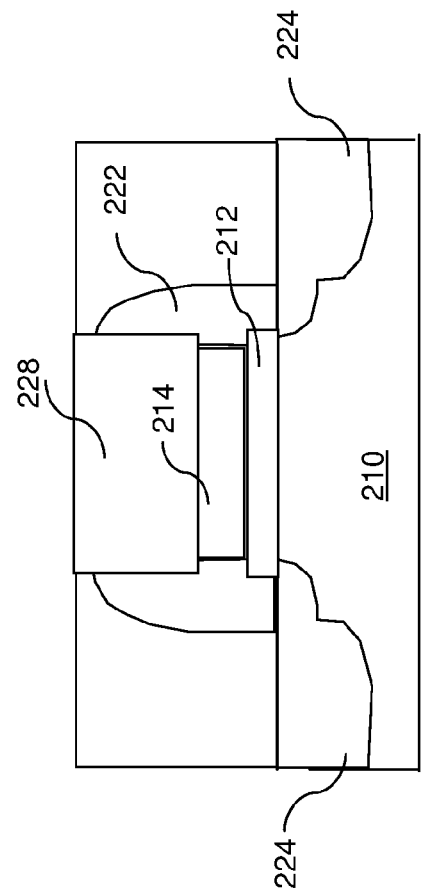

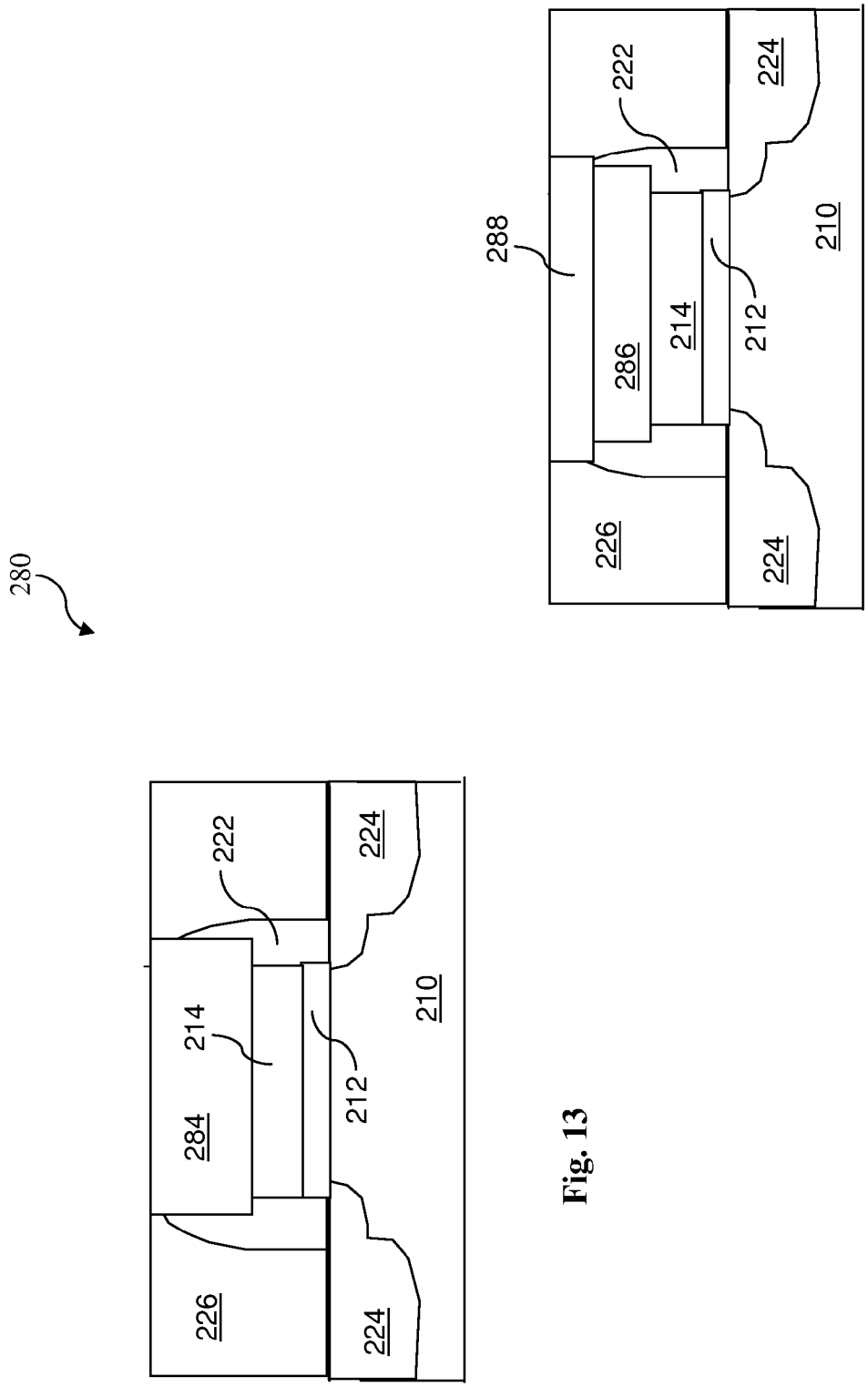

TRANSISTOR PERFORMANCE WITH METAL GATE

PRIORITY DATA

This application claims priority to Provisional Application Ser. No. 61/103,051 filed on Oct. 6, 2008, entitled "Improving Transistor Performance With Metal Gate", the entire disclosure of which is incorporated herein by reference.

BACKGROUND

When a metal-oxide-semiconductor field-effect transistors (MOSFETs) is scaled down through various technology nodes, high k dielectric materials and metals are adopted for gate dielectric and gate electrode, respectively, to form a gate stack. However, the gate dielectric scaling has little improvement to the device speed because of various parasitic capacitances associated with the gate stack. By the conventional process and the structure formed thereby, the parasitic capacitance between the contact and the gate stack, and the parasitic capacitance between the gate stack and the substrate cannot be effectively reduced. Additionally, other possible issues associated with the conventional method include gate filling and silicon recess.

SUMMARY

One of the broader forms of an embodiment of the present invention involves a method for making a semiconductor device having metal gate stacks. The method includes forming a high k dielectric material layer on a semiconductor substrate; forming a metal gate layer on the high k dielectric material layer; forming a top gate layer on the metal gate layer; patterning the top gate layer, the metal gate layer and the high k dielectric material layer to form a gate stack; performing an etching process to selectively recess the metal gate layer; and forming a gate spacer on sidewalls of the gate stack.

Another one of the broader forms of an embodiment of the present invention involves a method for making a semiconductor device having metal gate stacks. The method includes forming a patterned gate stack on a semiconductor substrate; forming source/drain features in the semiconductor substrate and substantially interposed between the source/drain features; forming an interlayer dielectric layer (ILD) on the semiconductor substrate; applying a first chemical mechanical polishing (CMP) process to the ILD layer; performing an etching process to form a gate trench aligned with the gate stack and extended to the ILD layer; and filling the gate trench with a gate electrode.

Yet another one of the broader forms of an embodiment of the present invention involves a semiconductor device. The semiconductor device includes a source and a drain in a semiconductor substrate, wherein the source and drain defines a first dimension from the source to drain; and a metal gate stack disposed on the semiconductor substrate and substantially interposed between the source and the drain. The metal gate stack includes a high k dielectric feature; a first metal feature disposed on the high k dielectric feature and spanned to a first length in the first dimension; and a second metal feature substantially disposed on the first metal feature and spanned to a second length in the first dimension, the second length being greater than the first length.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Various drawings and associated text are provided in a Power Point file. Particularly.

FIGS. 2 through 7 are sectional views of a semiconductor device having a metal gate structure constructed according to aspects of the present disclosure in one or more embodiments.

FIGS. 9 through 14 are sectional views of a semiconductor structure having a metal gate structure at various fabrication stages constructed according to various aspects of the present disclosure in other embodiments.

DETAILED DESCRIPTION

Figure 1:
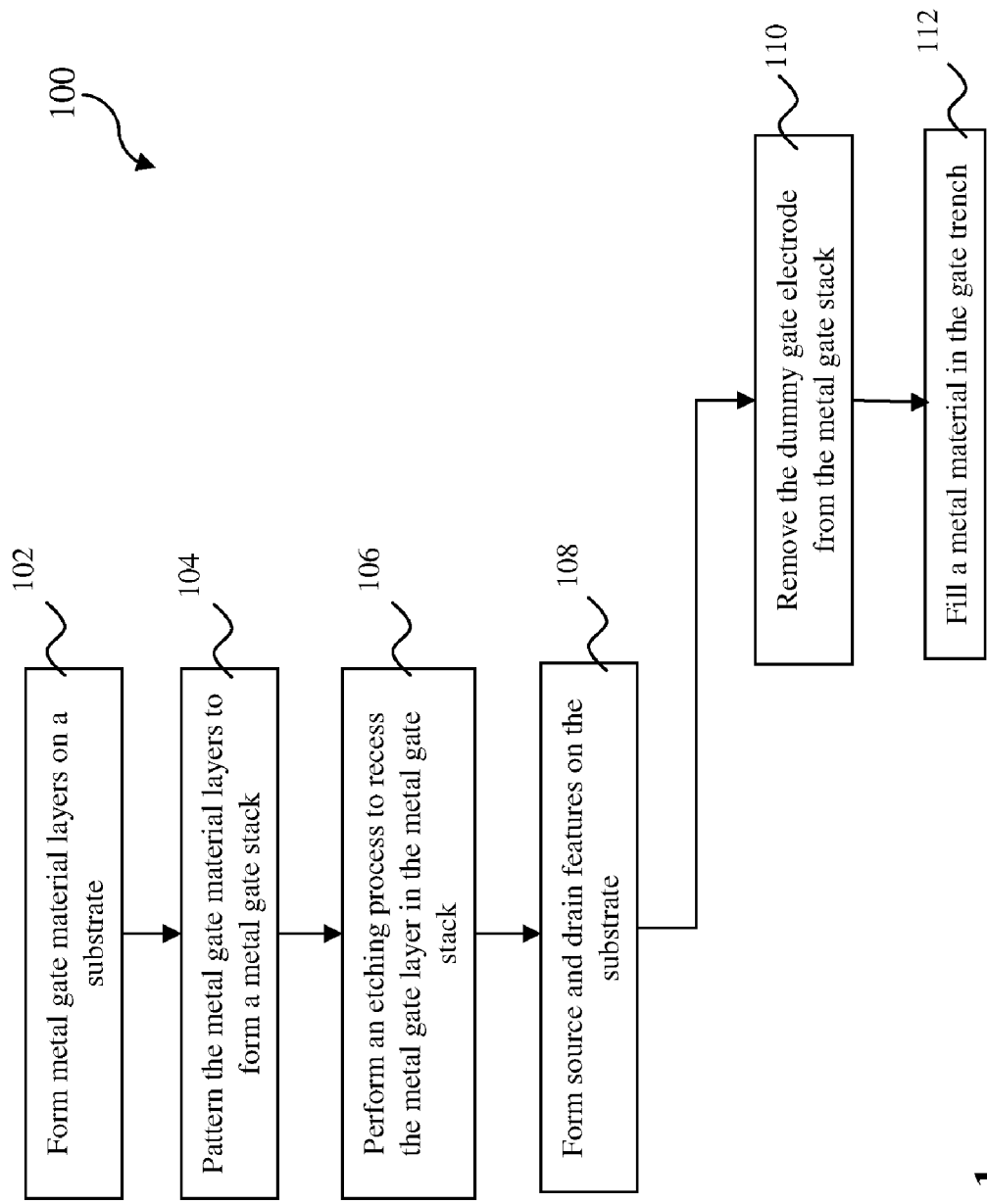
FIG. 1 is a flowchart of a method for making a semiconductor device having a metal gate structure constructed according to aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 is a flowchart of a method 100 for making a semiconductor device having a metal gate structure constructed according to aspects of the present disclosure. FIGS. 2 through 7 are sectional views of a semiconductor device 200 having a metal gate structure constructed according to aspects of the present disclosure in various embodiments. The semiconductor device 200 and the method 100 of making the same are collectively described below.

Figure 2:
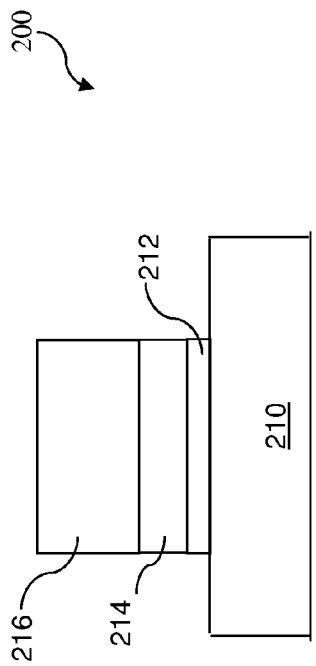

Referring to FIGS. 1 and 2, the method 100 begins at step 102 by forming various gate material layers on a semiconductor substrate 210. The semiconductor substrate 210 includes silicon. The substrate further includes various isolation features, such as shallow trench isolation (STI), and various doped features, such as n type wells and p type wells formed by various ion implantation or diffusion techniques known in the art. The substrate 210 may additionally include germanium, silicon germanium or other suitable semiconductor material. In other embodiments, the substrate 210 may additionally include another semiconductor material such as diamond, silicon carbide, gallium arsenic, GaAsP, AlInAs, AlGaAs, GaInP, or other proper combination thereof.

At this step, a high k dielectric material layer 212 is formed on the substrate. The high k dielectric material layer 212 is formed by a suitable process such as an atomic layer deposition (ALD). Other methods to form the high k dielectric material layer include metal organic chemical vapor deposition (MOCVD), physical vapor deposition (PVD), UV-Ozone Oxidation and molecular beam epitaxy (MBE). In one embodiment, the high k dielectric material includes HfO2. Alternatively, the high k dielectric material layer includes metal nitrides, metal silicates or other metal oxides.

An interfacial layer (IL) (not shown) may be additionally formed on the substrate and is interposed between the semiconductor substrate 210 and the high k dielectric material layer 212. The interfacial layer includes a thin silicon oxide layer in one example. The thin silicon oxide is formed on the substrate 210 before forming the high k dielectric material layer. The thin silicon oxide layer may be formed by atomic layer deposition (ALD) or thermal oxidation.

A metal layer 214 is formed on the high k dielectric material layer. The metal layer 214 is formed by PVD or other suitable process. In one embodiment, the metal layer includes titanium nitride. In another embodiment, the metal gate layer may include tantalum nitride, molybdenum nitride, tungsten nitride, tungsten, tantalum carbide, tantalum carbide nitride, titanium aluminum nitride or a combination thereof. The metal layer is chosen to have a proper work function for the design field effect transistor (FET). In one embodiment, the metal layer 214 has a thickness less than about 50 angstrom. In another embodiment, the metal layer may have a multi-film structure.

A capping layer (not shown) may be disposed on the high k dielectric material layer. The capping layer is interposed between the high k dielectric material layer and the metal layer. In one embodiment, the capping layer includes lanthanum oxide (LaO). The capping layer may alternatively includes other suitable material, such as aluminum oxide (Al2O3). The capping layer can be formed by a suitable process, such as PVD or ALD.

A top gate layer 216 is further formed on the metal layer 214. The top gate layer may have a thickness ranging between about 500 angstrom and about 1000 angstrom. The top gate layer may include a multi-film structure. In one embodiment, the top gate layer includes a second metal layer. For example, the top gate layer includes aluminum, copper or tungsten. The metal layer may be formed a suitable method, such as PVD. In another embodiment, the top gate layer includes a silicon layer, such as polysilicon or amorphous silicon. The silicon layer may be formed by a chemical vapor deposition (CVD) process. Silane (SiH4) can be employed a chemical gas in the CVD process to form the silicon layer. In another embodiment, the top gate layer includes a dielectric material layer, such as silicon oxide.

Still referring to FIGS. 1 and 2, the method 100 proceeds to step 104 by patterning the various gate material layers to form a gate stack. In one embodiment, a patterned photoresist layer is formed on the gate material layers, defining one or more openings of the photoresist layer. The patterned photoresist layer is formed by a photolithography process. An exemplary photolithography process may include processing steps of photoresist coating, soft baking, mask aligning, exposing, post-exposure baking, developing photoresist and hard baking. The photolithography exposing process may also be implemented or replaced by other proper methods such as maskless photolithography, electron-beam writing, ion-beam writing, and molecular imprint. In this case, the gate material layers are patterned by etching the gate layers using the patterned photoresist layer as an etching mask.

Then the various gate material layers are etched away within the openings of the patterned photoresist layer by an etching process. In one embodiment, the etching process utilizes a dry etching process. In one example, the dry etching process implements a fluorine-containing plasma to remove the silicon layer. In another example, the dry etching process with the fluorine-containing plasma is implemented to remove the silicon layer, the metal layer and the high k dielectric material layer. In furtherance of the example, the etch gas includes CF4. Alternatively, the etching process may include multiple etching steps to etch the various gate material layers.

In another embodiment, a hard mask is formed on the gate layers. For example, when the top gate layer includes metal, the hard mask layer is formed on the top gate layer of metal. The hard mask layer includes one or more dielectric materials and is formed by a suitable process, such as CVD. In various embodiments, the hard mask layer includes silicon oxide, silicon nitride, silicon oxynitride or a combination thereof in a multi-film structure. A patterned photoresist layer is formed on the hard mask layer. Then the hard mask layer is etched away within the openings of the patterned photoresist layer, resulting in a patterned hard mask layer. The etching process applied to the hard mask layer can be a wet etching process or a dry etching process. For example, a hydrofluoric (HF) solution may be used to etch a silicon oxide hard mask layer.

In another embodiment, when the top gate layer include silicon or dielectric material layer, The top gate layer is used as a hard mask layer. In this case, the top gate layer is first patterned and then the rest of the gate material layers are patterned using the patterned top gate layer as an etch mask. In another embodiment, the top gate layer includes multiple films. A portion of the top gate layer is used as a hard mask to pattern the gate material layers.

Figure 3:
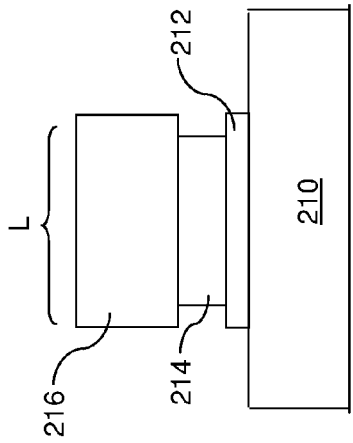

Referring to FIGS. 1 and 3, the method 100 proceeds to step 106 by performing an etching process to selectively etch the metal layer 214 such that the metal layer is recessed horizontally relative to the gate stack, also referred to as a notched metal gate. The gate stack has a length "L" as illustrated in FIG. 3. The metal layer is recessed such that the length of the metal layer is shorter than the length of the gate stack "L". In one example, the gate stack has a length of about 30 nm. The metal layer 214 is recessed about 5 nm from each side of the gate stack. The etching process can implement a wet etching procedure or a dry etching procedure. For example, when the metal layer includes titanium nitride (TiN), an ammonia-hydrogen peroxide-water (NH3/H2O2/H2O) solution is applied to selectively remove the titanium nitride from the sidewalls of the gate stack. In another example, a chlorine-containing plasma is alternatively used to recess the titanium nitride metal layer 214.

Figure 5:
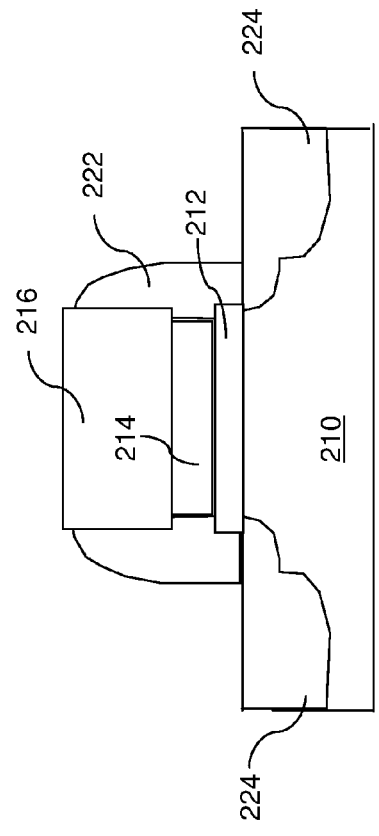
Figure 4:
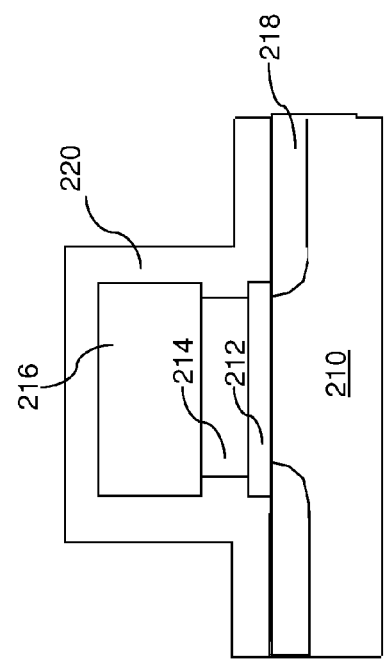

Referring to FIGS. 1, 4 and 5, the method 100 proceeds to step 108 by forming various source and drain features on the substrate 210. In one embodiment, a light doped drain (LDD) regions 218 are formed by an ion implantation process using the gate stack as an implanting mask. The LDD regions are substantially aligned with the edges of the gate stack. Since the metal layer 214 is recessed, the edge of the gate stack is the edge of the high k dielectric layer in the gate stack. Additionally, a halo implantation process may be implemented to eliminate the short channel effect.

Then a spacer 222 is formed on the sidewalls of the gate stack (or the sidewalls of the dielectric layer if present) by a technique known in the art. For example, the spacer includes a dielectric layer, such as silicon nitride or silicon oxide. The spacer 222 may have a multiple-layer structure. The spacer can be formed by a chemical vapor deposition (CVD) and then a dry etching process. As one example, a dielectric layer 220 is formed on the sidewalls of the gate stack and the substrate. The dielectric layer 220 is disposed on the sidewalls of the gate stack such that the subsequent formation of source/ drain features are offset from the gate stack for better device performance. Additionally, the dielectric layer is used to fill the recess of the metal layer and seal the high k dielectric material layer, therefore protecting these gate materials. The dielectric layer 220 includes silicon oxide, silicon nitride or other suitable dielectric material. The dielectric layer 220 can be formed by CVD, PVD or other suitable process. Then a dry etching process is applied to the dielectric layer to substantially remove thereof and end up with the spacer 222 on the sidewalls of the gate stack, as illustrated in FIG. 5.

Then a source and a drain are formed in the substrate by another ion implantation process. Thus formed source and drain are offset from the gate stack by the spacer 222. The LDD regions and the source/drains are collectively labeled as 224 in FIG. 5. An annealing process may be applied thereafter to the substrate to activate the source/drain features 224. The annealing process can be implemented by a suitable technique, such as rapid thermal annealing or laser annealing.

Silicide contact features (not shown) may be formed on the source and drain at this step. For example, a metal material layer is first deposited on the substrate. The metal material layer directly contacts the silicon substrate within the source and drain regions. Then an annealing process with a proper temperature is applied to the semiconductor device 200 such that the metal layer and the silicon substrate react to form silicide. The unreacted metal after the annealing can be removed from the substrate. The silicide contact may be formed on the gate stack as well when the top gate layer includes silicon and no additional hard mask presents on the gate stack. The metal material for silicide includes titanium, nickel, cobalt, platinum, palladium tungsten, tantalum or erbium in various embodiment.

The above method from step 102 to step 108 is referred to as a gate-first method since thus formed gate will remain in the final device. Alternatively, the method 100 from step 102 to step 112 can also be applicable to a gate-last process, in which a portion of the gate stack is removed thereafter and rebuilt for a proper work function tuned to a nMOS transistor or a pMOS transistor. The gate-last process is further described of the additional steps 110 and 112.

Referring to FIGS. 1 and 6, the method 100 may proceed to step 110 by removing the top gate layer or a portion of the top gate layer from the gate stack. An inter-level dielectric (ILD) layer 226 is formed on the substrate using a suitable process, such as CVD or spin-on glass (SOG). The ILD includes a dielectric material, such as silicon oxide, low k dielectric material or other suitable dielectric material. For example, the ILD layer is formed by a high density plasma CVD. The ILD layer is disposed on the substrate between the multiples gate stacks and on the gate stacks.

Then a chemical mechanical polishing (CMP) process is applied to the substrate to polish until the top gate layer is exposed or the hard mask layer is exposed if the hard mask layer is present. In the second situation, the hard mask layer also functions as an etch stop layer. An additional wet etching process is applied to selectively remove the hard mask. For example, if the hard mask is made of silicon nitride, a hot phosphoric acid (H3PO4) solution is used as an etchant to selectively remove the hard mask layer. Alternatively, the CMP process may resume to remove the hard mask layer as well.

Then, the top gate layer is selectively removed from the gate stack by an etching process, resulting in a gate trench. In one embodiment, the etching process is a wet etching process. The etchant is chosen such that the top gate layer can be selectively removed. For example, if the top gate layer includes silicon, a potassium hydroxide (KOH) solution may be used to remove the silicon top gate layer. In another embodiment, the etching process includes multiple etching steps tuned to remove the multiple films of the top gate layer.

Referring to FIGS. 1 and 7, the method 100 may proceed to step 110 by forming a gate electrode 228. The gate electrode includes a metal and may has a multi-layer structure with multi metal materials. First, the gate trench is filled with one or more metal materials by a suitable technique, such as PVD, CVD or plating. In one example, a p metal layer is deposited in the p gate trench for the proper work function. An additional conductive material, such as aluminum or tungsten, is then filled in the gate trench. A CMP process is then applied to remove the metal materials on the ILD layer, remove the excessive metal material within the gate stack and planarize the substrate surface for subsequent processing steps.

Figure 8:
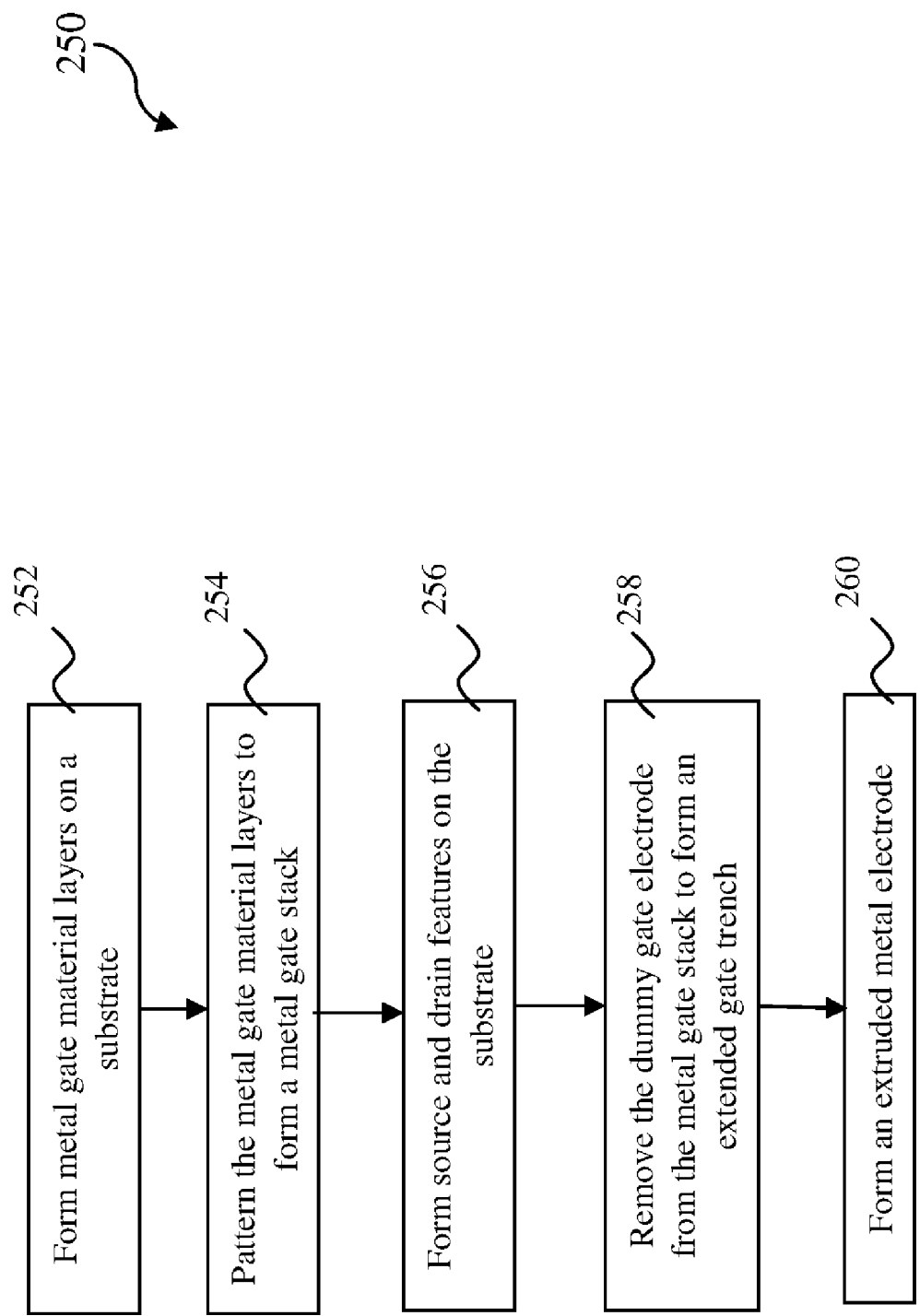
FIG. 8 is a flowchart of a method for making a semiconductor device having a metal gate structure constructed according to aspects of the present disclosure in another embodiment.

FIG. 8 is a flowchart of a method 250 for making a semiconductor device having a metal gate structure constructed according to aspects of the present disclosure in another embodiment. The method 250 is applicable to a gate-last process, in which a portion of the gate stack is removed thereafter and refilled. FIGS. 9 through 14 are sectional views of a semiconductor device 280 having a metal gate structure constructed according to aspects of the present disclosure in various embodiments. The semiconductor device 280 and the method 250 of making the same are collectively described below. The semiconductor device 280 is similar to the semiconductor device 200 of FIGS. 2-7. Accordingly, similar features are numbered the same for the sake of simplicity and clarity.

Figure 9:
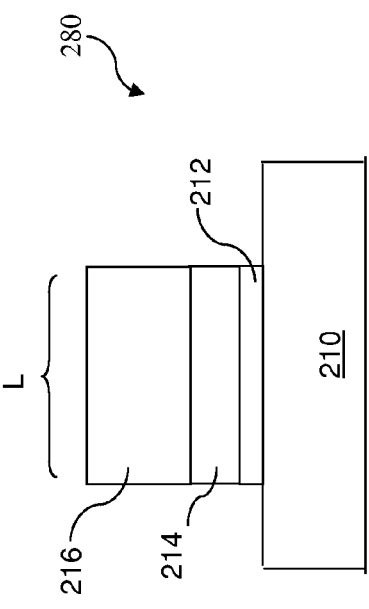

Referring to FIGS. 8 and 9, the method 250 begins at step 252 by forming various gate material layers on a semiconductor substrate 210, similar to the step 102 of the method 100. The semiconductor substrate 210 includes silicon. The substrate further includes various isolation features, such as shallow trench isolation (STI), and various doped features, such as n type wells and p type wells formed by various ion implantation or diffusion techniques known in the art. The substrate 210 may additionally include germanium, silicon germanium or other suitable semiconductor material.

At this step, a high k dielectric material layer 212 is formed on the substrate. The high k dielectric material layer 212 is formed by a suitable process such as an atomic layer deposition (ALD). Other methods to form the high k dielectric material layer include metal organic chemical vapor deposition (MOCVD), physical vapor deposition (PVD), UV-Ozone Oxidation and molecular beam epitaxy (MBE). In one embodiment, the high k dielectric material includes HfO2. Alternatively, the high k dielectric material layer includes metal nitrides, metal silicates or other metal oxides.

An interfacial layer (IL) (not shown) may be additionally formed on the substrate and is interposed between the semiconductor substrate 210 and the high k dielectric material layer 212. The interfacial layer includes a thin silicon oxide layer in one example. The thin silicon oxide is formed on the substrate 210 before forming the high k dielectric material layer. The thin silicon oxide layer may be formed by atomic layer deposition (ALD) or thermal oxidation.

A metal layer 214 is formed on the high k dielectric material layer. The metal layer 214 is formed by PVD or other suitable process. In one embodiment, the metal layer includes titanium nitride. In another embodiment, the metal gate layer may include tantalum nitride, molybdenum nitride, tungsten nitride, tungsten, tantalum carbide, tantalum carbide nitride, titanium aluminum nitride or a combination thereof. The metal layer is chosen to have a proper work function. In one embodiment, the metal layer may have a multi-film structure.

A capping layer (not shown) may be disposed on the high k dielectric material layer. The capping layer is interposed between the high k dielectric material layer and the metal layer. In one embodiment, the capping layer includes lanthanum oxide (LaO). The capping layer may alternatively includes other suitable material, such as aluminum oxide (Al2O3). The capping layer can be formed by a suitable process, such as PVD or ALD.

A top gate layer 216 is further formed on the metal layer 214. The top gate layer may include a multi-film structure. In various embodiments, the top gate layer may include a metal, silicon, silicon oxide, or a combination in a multilayer structure.

Still referring to FIGS. 8 and 9, the method 250 proceeds to step 254 by patterning the various gate material layers to form a gate stack. The patterned gate stack has a length "L" as illustrated in FIG. 9. In one example, the length "L" of the gate stack is about 30 nm. In one embodiment, a patterned photoresist layer is formed on the gate material layers, defining one or more openings of the photoresist layer. The patterned photoresist layer is formed by a photolithography process. An exemplary photolithography process may include processing steps of photoresist coating, soft baking, mask aligning, exposing, post-exposure baking, developing photoresist and hard baking. The photolithography exposing process may also be implemented or replaced by other proper methods such as maskless photolithography, electron-beam writing, ion-beam writing, and molecular imprint. In this case, the gate material layers are patterned by etching the gate layers using the patterned photoresist layer as an etching mask.

Then the various gate material layers are etched away within the openings of the patterned photoresist layer by an etching process. In one embodiment, the etching process utilizes a dry etching process. In one example, the dry etching process implements a fluorine-containing plasma to remove the silicon layer. In another example, the dry etching process with the fluorine-containing plasma is implemented to remove the silicon layer, the metal layer and the high k dielectric material layer. In furtherance of the example, the etch gas includes CF4. Alternatively, the etching process may include multiple etching steps to etch the various gate material layers.

In another embodiment, a hard mask is formed on the gate layers. For example, when the top gate layer includes metal, the hard mask layer is formed on the top gate layer of metal. The hard mask layer includes one or more dielectric materials and is formed by a suitable process, such as CVD. In various embodiments, the hard mask layer includes silicon oxide, silicon nitride, silicon oxynitride or a combination thereof in a multi-film structure. A patterned photoresist layer is formed on the hard mask layer. Then the hard mask layer is etched away within the openings of the patterned photoresist layer, resulting in a patterned hard mask layer. The etching process applied to the hard mask layer can be a wet etching process or a dry etching process. For example, a hydrofluoric (HF) solution may be used to etch a silicon oxide hard mask layer.

In another embodiment, when the top gate layer include silicon or dielectric material layer, The top gate layer is used as a hard mask layer. In this case, the top gate layer is first patterned and then the rest of the gate material layers are patterned using the patterned top gate layer as an etch mask. In another embodiment, the top gate layer includes multiple films. A portion of the top gate layer is used as a hard mask to pattern the gate material layers.

Figure 10:
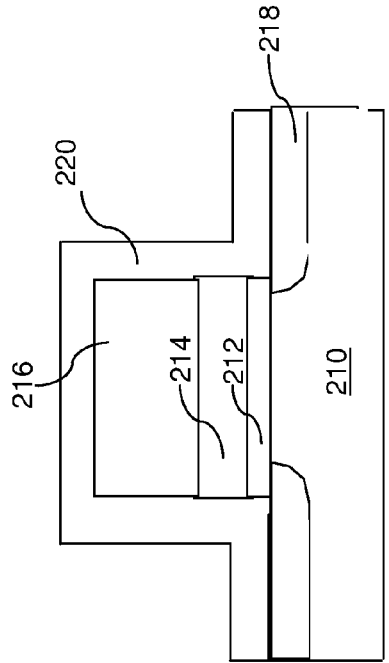
Figure 11:
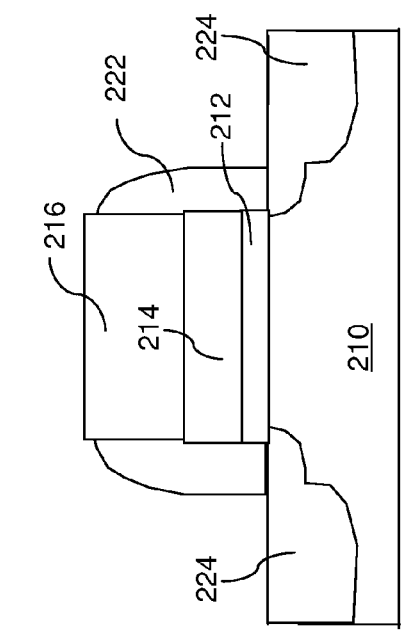

Referring to FIGS. 8, 10 and 11, the method 250 proceeds to step 256 by forming various source and drain features on the substrate 210. In one embodiment, a light doped drain (LDD) regions 218 are formed by an ion implantation process using the gate stack as an implanting mask. The LDD regions are substantially aligned with the edges of the gate stack. Since the metal layer 214 is recessed, the edge of the gate stack is the edge of the high k dielectric layer in the gate stack.

Then a spacer 222 is formed on the sidewalls of the gate stack (or the sidewalls of the dielectric layer if present) by a technique known in the art. For example, the spacer includes a dielectric layer, such as silicon nitride or silicon oxide. The spacer 222 may have a multiple-layer structure. The spacer can be formed by a chemical vapor deposition (CVD) and then a dry etching process. As one example, a dielectric layer 220 is formed on the sidewalls of the gate stack and the substrate. The dielectric layer 220 is disposed on the sidewalls of the gate stack such that the subsequent formation of source/drain features are offset from the gate stack for better device performance. Additionally, the dielectric layer is used to fill the recess of the metal layer and seal the high k dielectric material layer, therefore protecting these gate materials. The dielectric layer 220 includes silicon oxide, silicon nitride or other suitable dielectric material. The dielectric layer 220 can be formed by CVD, PVD or other suitable process. Then a dry etching process is applied to the dielectric layer to substantially remove thereof and end up with the spacer 222 on the sidewalls of the gate stack, as illustrated in FIG. 11.

Then a source and a drain are formed in the substrate by another ion implantation process. Thus formed source and drain are offset from the gate stack by the spacer 222. The LDD regions and the source/drains are collectively labeled as 224 in FIG. 11. An annealing process may be applied thereafter to the substrate to activate the source/drain features 224. The annealing process can be implemented by a suitable technique, such as rapid thermal annealing or laser annealing.

Silicide contact features (not shown) may be formed on the source and drain at this step. For example, a metal material layer is first deposited on the substrate. The metal material layer directly contacts the silicon substrate within the source and drain regions. Then an annealing process with a proper temperature is applied to the semiconductor device 200 such that the metal layer and the silicon substrate react to form silicide. The unreacted metal after the annealing can be removed from the substrate. The silicide contact may be formed on the gate stack as well when the top gate layer includes silicon and no additional hard mask presents on the gate stack. The metal material for silicide includes titanium, nickel, cobalt, platinum, palladium tungsten, tantalum or erbium in various embodiment.

Figure 12:
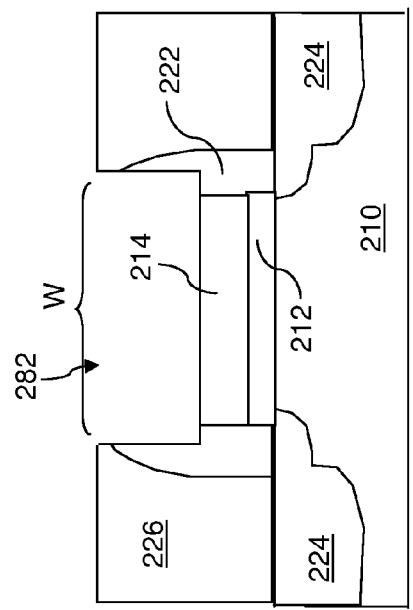

Referring to FIGS. 8 and 12, the method 250 proceeds to step 258 by removing the top gate layer from the gate stack to form an extended gate trench 282. The gate trench 282 has a length "W" greater than the length "L" of the gate stack. Therefore, the portion of the gate spacer and even a portion of the ILD layer may be removed to form the extended gate trench. An ILD layer 226 is formed on the substrate using a suitable process, such as CVD or spin-on glass. The ILD includes a dielectric material, such as silicon oxide, low k dielectric material or other suitable dielectric material. For example, the ILD layer is formed by a high density plasma CVD. The ILD layer is disposed on the substrate between the multiples gate stacks and on the gate stacks.

Then a CMP process is applied to the substrate to polish until the top gate layer is exposed or the hard mask layer is exposed if the hard mask layer is present. In the second situation, the hard mask layer also functions as an etch stop layer. An additional wet etching process is applied to selectively remove the hard mask. For example, if the hard mask is made of silicon nitride, a hot phosphoric acid (H3PO4) solution is used as an etchant to selectively remove the hard mask layer. Alternatively, the CMP process may resume to remove the hard mask layer as well.

Then a pattered resist layer may be formed on the device 280, defining an opening aligned with the gate stack and having a length of about "W". Then an etching process, such as a plasma etch, is applied to remove the top gate layer, a portion of the spacer and a portion of the ILD layer using the patterned resist layer as an etch mask. In another embodiment, the top gate layer is selectively removed by an etching process to form a gate trench. Then a second etching process is applied to sidewalls of the gate trench such that the gate trench is extended into the gate spacer and/or the ILD layer. For example, after the removal of the top gate layer from the gate stack, a diluted hydrofluoric acid solution may be further applied to the sidewalls of the gate stack to enlarge the length of the gate trench.

Referring to FIGS. 8 and 13, the method 250 proceeds to step 260 by forming an extended gate electrode 284 in the gate trench 282. The extended gate electrode 284 has a length "W" greater than the dimension "L", which is the length of the metal layer 214 and the high k dielectric material layer 212. The extended gate electrode 284 may include various one or more metal materials. For example, the gate electrode 284 includes aluminum, tungsten or other suitable metal to fill in the gate trench. In another example, the gate electrode may includes an additional metal layer formed on the metal layer 214 and tuned for a proper work function. For example, a p metal layer is deposited in the p gate trench for the proper work function. Then aluminum or tungsten is formed on the p metal layer. A CMP process is then applied to remove the excessive conductive material and planarize the substrate surface for subsequent processing steps.

In another embodiment with reference to FIG. 14, the extended gate electrode may have a multi-layer structure and a ladder profile such that the gate electrode has a greater length toward the top surface. For example, the extended gate electrode include two layers. The first electrode layer 286 is disposed on the metal layer 214 and has a length greater than the "L". The second electrode layer 288 is disposed on the first electrode layer 286 and has a length greater than the length of the first electrode layer 286, as illustrated in FIG. 14. Such extended gate electrode with a ladder profile can be formed by multiple etching steps. Then one or more metal materials are filled into the gate trench having the ladder profile. Then a CMP process is applied to the device 280 to planarize the surface of the semiconductor device 280.

Although not shown, other processing step may present to form various doped regions such as n-wells and p-wells, devices features such as multilayer interconnection (MLI). In one embodiment, the multilayer interconnection are further formed. The multilayer interconnection includes vertical interconnects, such as conventional vias or contacts, and horizontal interconnects, such as metal lines. The various interconnection features may implement various conductive materials including copper, tungsten and silicide. In one example, a damascene process is used to form copper related multilayer interconnection structure. In another embodiment, tungsten is used to form tungsten plug in the contact holes.

In another embodiment, the isolation features in the substrate may include shallow trench isolation (STI). The formation of STI may include etching a trench in a substrate and filling the trench by insulator materials such as silicon oxide, silicon nitride, or silicon oxynitride. The filled trench may have a multi-layer structure such as a thermal oxide liner layer with silicon nitride filling the trench. In one embodiment, the STI structure may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back, and using nitride stripping to leave the STI structure.

In another embodiment, the metal layer for an n-type MOS transistor is different from the metal layers of the p-type MOS with individual tuned work functions. In another example, the gate spacers may have a multilayer structure and may include silicon oxide, silicon nitride, silicon oxynitride, or other dielectric material. N-type dopant impurities employed to form the associated doped regions may include phosphorus, arsenic, and/or other materials. P-type dopant impurities may include boron, indium, and/or other materials.

The present disclosure is not limited to applications in which the semiconductor structure includes a MOS transistor, and may be extended to other integrated circuit having a metal gate stack. For example, the semiconductor device may include a dynamic random access memory (DRAM) cell, a single electron transistor (SET), and/or other microelectronic devices (collectively referred to herein as microelectronic devices). In another embodiment, the semiconductor device 200 includes FinFET transistors. Of course, aspects of the present disclosure are also applicable and/or readily adaptable to other type of transistor, including single-gate transistors, double-gate transistors and other multiple-gate transistors, and may be employed in many different applications, including sensor cells, memory cells, logic cells, and others.

Although embodiments of the present disclosure have been described in detail, those skilled in the art should understand that they may make various changes, substitutions and alterations herein without departing from the spirit and scope of the present disclosure. In one embodiment, the semiconductor substrate may include an epitaxial layer. For example, the substrate may have an epitaxial layer overlying a bulk semiconductor. In another embodiment, the substrate includes silicon germanium in the source and drain formed by a selective epitaxial growth (SEG) process for the strain effect. The stress is built in the channel region by utilizing the disclosed fully silicide gate approach. Furthermore, the substrate may include a semiconductor-on-insulator (SOI) structure such as a buried dielectric layer. Alternatively, the substrate may include a buried dielectric layer such as a buried oxide (BOX) layer, such as that formed by a method referred to as separation by implantation of oxygen (SIMOX) technology, wafer bonding, SEG, or other proper method.

Figure 16:
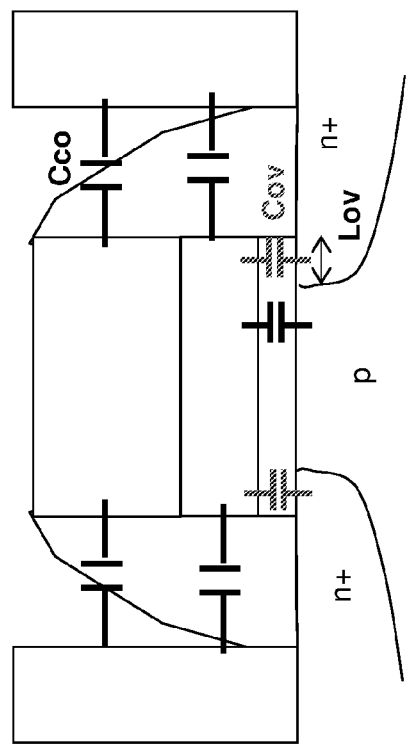
FIG. 16 is a sectional view of a semiconductor structure having a recessed metal layer in the metal gate stack.
Figure 15:
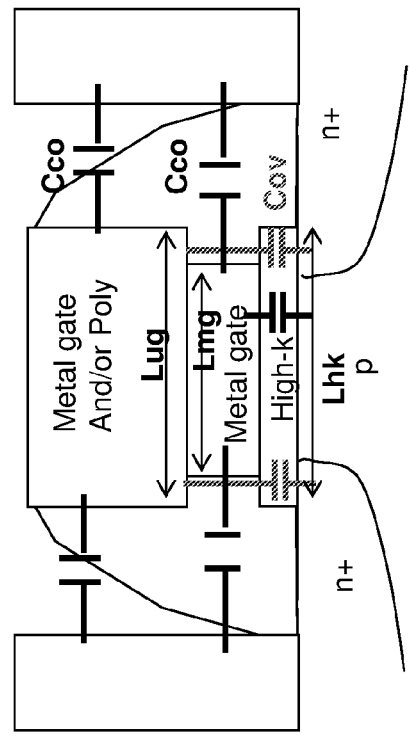
FIG. 15 is a sectional view of a semiconductor structure without a recessed metal layer in the gate stack.

Furthermore, the various gate stacks can be formed by a hybrid approach wherein one type of stacks are formed by a gate-first approach and the another type gate stacks are formed by a gate-last approach. In this case, at least one of the gate-first or gate-last approaches adopts the disclosed method utilizing the recessed metal layer or extended gate electrode. In various embodiments of the disclosed method and the structure, one or more benefits or advantages may present. For example, the parasitic capacitance between the metal layer 214 of the gate stack and the metal contact is reduced. In another embodiment, the parasitic capacitance between the substrate and gate electrode is also reduced. FIG. 15 illustrates a sectional view of a gate stack without a recessed metal layer. FIG. 16 illustrates a sectional view of a gate stack with a recessed metal layer. For gate-first and gate-last processes, the capacitance Cov is reduced without significant manufacturing cost. Cco can be reduced without area penalty (device density is not degraded). In another example of the semiconductor device 280, such as illustrated in FIGS. 13 and 14, the gate-last metal filling is improved without increasing the gate length.

Thus, the present disclosure provides a method for making an integrated circuit having metal gate stacks. The method includes forming a high k dielectric material layer on a semiconductor substrate; forming a metal gate layer on the high k dielectric material layer; forming a top gate layer on the metal gate layer; patterning the top gate layer, the metal gate layer and the high k dielectric material layer to form a gate stack; performing an etching process to selectively recess the metal gate layer; and forming a gate spacer on sidewalls of the gate stack.

The disclosed method may further include forming light doped drain (LDD) features in the semiconductor substrate before the forming the gate spacer; and forming heavily doped source/drain features after the forming the gate spacer. The method may further include forming a patterned mask layer on the top gate layer before the patterning to form the gate stack. The patterned mask layer may include a patterned photoresist layer. The patterned mask layer may include a patterned dielectric layer. The method may further include forming an interlayer dielectric (ILD) layer on the semiconductor substrate; performing a chemical mechanical polishing (CMP) process to the ILD layer; removing the top gate layer, resulting in a gate trench; and filling in a second metal gate layer in the gate trench. The metal gate layer may include a multi-layer structure. The top gate layer may include a conductive material selected from the group consisting of a metal, doped polysilicon, doped amorphous silicon, or combination thereof. The top gate layer may include silicon oxide. The metal gate layer may include titanium nitride. The performing the etching process may include applying an ammonia-hydrogen peroxide-water (NH3/H2O2/H2O) solution to selectively etch the metal gate layer. The performing the etching process may include applying a chlorine-containing plasma to selectively etch the metal gate layer. The method may further include forming a silicon oxide layer interposed between the semiconductor substrate and the high k dielectric material layer.

The present disclosure also provides another embodiment of a method for making a semiconductor device having metal gate stacks. The method includes forming a patterned gate stack on a semiconductor substrate; forming source/drain features in the semiconductor substrate and substantially interposed between the source/drain features; forming an interlayer dielectric layer (ILD) on the semiconductor substrate; applying a first chemical mechanical polishing (CMP) process to the ILD layer; performing an etching process to form a gate trench aligned with the gate stack and extended to the ILD layer; and filling the gate trench with a gate electrode.

In this method, the filling the gate trench may include deposing a gate electrode layer in the gate trench and the ILD layer; and applying a second CMP process to remove an excessive portion of the gate electrode layer. The filling the gate trench may include filling multiple metal films in the gate trench. The performing the etching process may include applying multiple etching steps to form the gate trench with a step profile.

The present disclosure also provides an embodiment of a semiconductor device. The semiconductor device includes a source and a drain in a semiconductor substrate, wherein the source and drain defines a first dimension from the source to drain; and a metal gate stack disposed on the semiconductor substrate and substantially interposed between the source and the drain. The metal gate stack further includes a high k dielectric feature; a first metal feature disposed on the high k dielectric feature and spanned to a first length in the first dimension; and a second metal feature substantially disposed on the first metal feature and spanned with a second length greater than the first length.

In the disclosed semiconductor device, the metal gate stack may further include a third metal feature substantially disposed on the second metal feature and spanned with a third length greater than the second length. The high k dielectric feature may be spanned to the first length in the first dimension and aligned to the first metal feature. The high k dielectric feature may be spanned to the second length in the first dimension and aligned to the second metal feature. The first metal feature may include titanium nitride. The first metal feature may include a multi-film structure.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for making a semiconductor device having metal gate stacks comprising:
   forming a high k dielectric material layer on a semiconductor substrate;
   forming a first metal gate layer on the high k dielectric material layer;
   forming a top gate layer on the first metal gate layer;
   patterning the top gate layer, the first metal gate layer and the high k dielectric material layer to form a gate stack;
   performing an etching process to selectively recess the first metal gate layer;
   after performing the etching process, forming an interlayer dielectric (ILD) layer on the semiconductor substrate;
   chemical mechanical polishing (CMP) the ILD layer;
   removing the top gate layer after CMP thereby resulting in a gate trench; and
   forming in a second metal gate layer in the gate trench.

2. The method of claim 1, further comprising:
   forming light doped drain (LDD) features in the semiconductor substrate before the forming a gate spacer on sidewalls of the gate stack; and
   forming heavily doped source/drain features after the forming the gate spacer.

3. The method of claim 1, further comprising forming a patterned mask layer on the top gate layer before the patterning to form the gate stack.

4. The method of claim 3, wherein the patterned mask layer comprises a patterned photoresist layer.

5. The method of claim 3, wherein the patterned mask layer comprises a patterned dielectric layer.

6. The method of claim 1, wherein the first metal gate layer comprises a multi-layer structure.

7. The method of claim 1, wherein the top gate layer comprises a conductive material selected from the group consisting of polysilicon and amorphous silicon.

8. The method of claim 1, wherein the top gate layer comprises silicon oxide.

9. The method of claim 1, wherein the first metal gate layer comprises titanium nitride.

10. The method of claim 9, wherein the performing the etching process comprises applying an ammonia-hydrogen peroxide-water ($NH_3/H_2O_2/H_2O$) solution to selectively etch the first metal gate layer.

11. The method of claim 9, wherein the performing the etching process comprises applying a chlorine-containing plasma to selectively etch the first metal gate layer.

12. The method of claim 1, further comprising forming a silicon oxide layer interposed between the semiconductor substrate and the high k dielectric material layer.

13. A method for making a semiconductor device having metal gate stacks comprising:
  forming a gate stack on a semiconductor substrate, wherein the gate stack includes a gate dielectric layer, a first metal layer, and a top gate layer, wherein the first metal gate layer and the top gate layer include a different composition;
  forming source/drain features in the semiconductor substrate and substantially interposed between the source/drain features;
  after forming the source/drain features, forming an interlayer dielectric layer (ILD) on the semiconductor substrate and the gate stack;
  chemical mechanical polishing (CMP) the ILD layer to expose a top surface of the top gate layer;
  performing an etching process to remove the top gate layer to form a gate trench above the first metal layer, wherein the gate trench has a width greater than the top gate layer; and
  filling the gate trench with a work function material.

14. The method of claim 13, wherein the filling the gate trench comprising:
  depositing the work function material in the gate trench and on the ILD layer; and
  applying a second CMP process to remove an excessive portion of the gate electrode layer.

15. The method of claim 13, wherein the filling the gate trench comprising filling multiple metal films in the gate trench.

16. The method of claim 13, wherein the performing the etching process comprising applying multiple etching steps to form the gate trench with a step profile.

17. A semiconductor device, comprising:
  a source and a drain in a semiconductor substrate, wherein the source and drain defines a first dimension from the source to the drain; and
  a metal gate stack disposed on the semiconductor substrate and substantially interposed
  between the source and the drain, wherein the metal gate stack includes: a high k dielectric feature;
  a first metal feature disposed on the high k dielectric feature and spanned to a first length in the first dimension;
  a second metal feature substantially disposed on the first metal feature and spanned to a second length in the first dimension, the second length being greater than the first length, and
  a third metal feature substantially disposed on the second metal feature and spanned to a third length in the first dimension, the third length being greater than the second length.

18. The semiconductor device of claim 17, wherein the third metal feature has a different composition than the first metal feature and the second metal feature.

19. The semiconductor device of claim 17, wherein the high k dielectric feature is spanned to the first length in the first dimension and aligned to the first metal feature.

20. The semiconductor device of claim 17, wherein the high k dielectric feature is spanned to the second length in the first dimension and aligned to the second metal feature.

21. The semiconductor device of claim 17, wherein the first metal feature comprises titanium nitride.

22. The semiconductor device of claim 17, wherein the first metal feature comprises a multi-film structure.

23. The method of claim 13, wherein the forming the gate stack includes forming the first metal layer and the top gate layer having substantially collinear sidewalls, and wherein the etching the top gate layer to form the gate trench includes etching a spacer formed on the sidewalls of the top gate layer.

* * * * *